United States Patent [19]
Watkins et al.

[11] Patent Number: 5,596,290
[45] Date of Patent: Jan. 21, 1997

[54] DIRECT FREQUENCY SYNTHESIZER HAVING MODERATE BANDWIDTH

[75] Inventors: Grant H. Watkins, Dunkirk; Norman G. Matthews, Sparks; Aldez C. Hazzard, Jessup; John P. Muhlbaier, Joppa, all of Md.

[73] Assignee: Northrop Grumman Corporation, Los Angeles, Calif.

[21] Appl. No.: 607,924

[22] Filed: Feb. 28, 1996

Related U.S. Application Data

[63] Continuation of Ser. No. 460,513, Jun. 2, 1995, abandoned, which is a continuation of Ser. No. 133,429, Oct. 8, 1993, abandoned.

[51] Int. Cl.$^6$ .......................... H03B 21/00; H03B 19/00; H03K 21/00
[52] U.S. Cl. .......................... 327/105; 327/113; 327/115; 327/116
[58] Field of Search .......................... 328/14, 15, 38.1, 328/140; 307/219.1, 271, 529; 327/105, 113, 115, 116

[56] References Cited

U.S. PATENT DOCUMENTS

| | | | |
|---|---|---|---|
| 4,725,786 | 2/1988 | Papaieck | 328/14 |
| 4,791,377 | 12/1988 | Grandfield et al. | 328/14 |
| 4,878,027 | 10/1989 | Carp et al. | 328/14 |
| 5,028,887 | 7/1991 | Gilmore | 328/14 |
| 5,128,623 | 7/1992 | Gilmore | 328/14 |
| 5,166,629 | 11/1992 | Watkins et al. | 328/14 |
| 5,184,093 | 2/1993 | Itoh et al. | 328/14 |

*Primary Examiner*—David C. Nelms
*Assistant Examiner*—Trong Phan

[57] ABSTRACT

A low cost direct frequency synthesizer is structured to operate with moderate bandwidth, good noise performance, superior spurious performance, and fast switching. The direct frequency synthesizer employs a starter frequency signal $f_o$ (33-1) and a set of LO frequency signals $f_1$ through $f_n$ (35-1) spaced from each other by a frequency increment $\delta$. A mixer circuit (34-1) generates a product of the starter frequency signal and the LO frequency signals. A divider (31-1) has a divider ratio equal to N. The number of LO frequency signals is equal to or less than N. The starter frequency $f_o$ has a value equal to $\delta$ times (N+x) where x is equal to 0 or a positive integer. The LO frequency $f_1$ has a value equal to $(N+1)f_o$. An intermediate nonswitchable band pass filter (36-1) passes a difference portion of the mixer product to the divider, and a nonswitchable output band pass filter (38-1) receives an output from the divider to generate a moderate bandwidth output.

8 Claims, 9 Drawing Sheets

FIG. 5
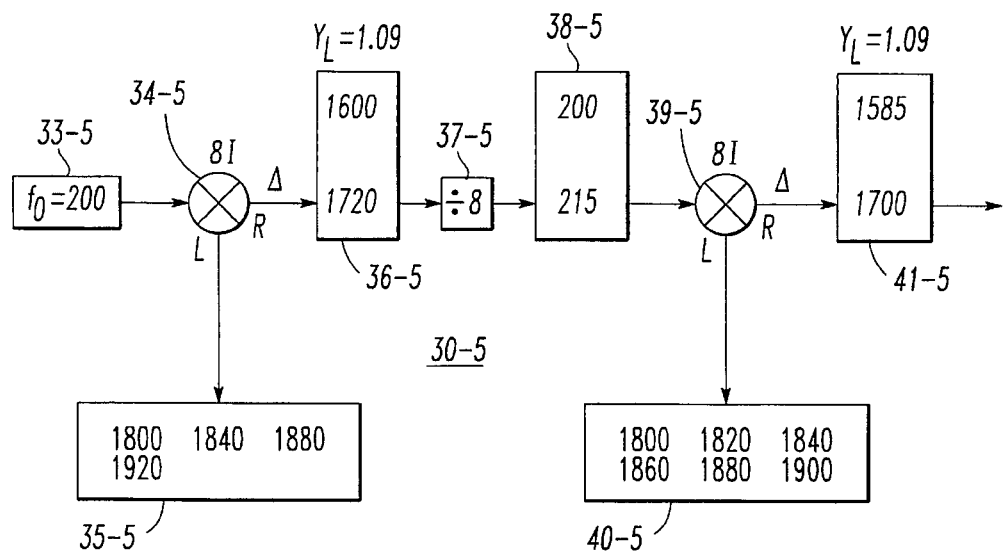
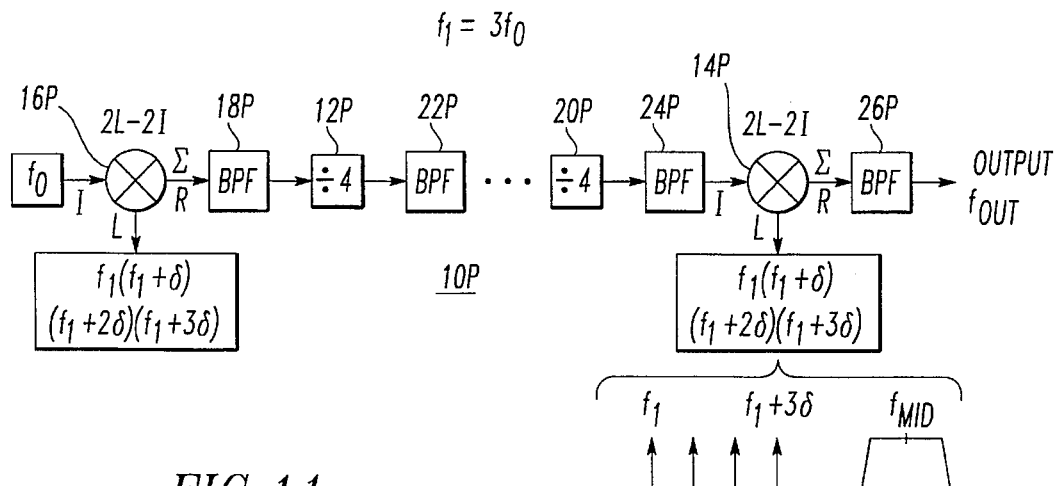
FIG. 11
PRIOR ART

DIRECT FREQUENCY SYNTHESIZER HAVING MODERATE BANDWIDTH

This application is a continuation, of application Ser. No. 08/460,513 filed on Jun. 2, 1995, now abandoned which is a continuation of application Ser. No. 08/133,429 filed on Oct. 8, 1993, abandoned.

The present invention relates to radar and communication systems and more particularly to frequency synthesizers employed therein.

The direct frequency synthesizer design has provided possibilities for improved synthesizers in contrast to the limited capabilities of conventional synthesizer designs. Thus, the direct frequency synthesizer design has offered the possibility of producing better product performance, especially shorter switching times and lower phase and spurious noise, while simultaneously providing design simplicity that enhances product reliability and reduces product cost.

In the direct frequency synthesizer, a set of input frequency signals differ from each other by a fixed increment and are derived from a single master oscillator and beat against one or more starter frequency signals in a first stage mixer. A larger set of frequency signals are generated at the output of the first stage, with the output signals differing from each other by a smaller fixed increment. A second and additional stages can be cascaded to the first stage and similarly structured and operated to produce a final output frequency signal that is selected by switchable filters.

Many prior direct synthesizer designs have been limited to single-stage circuits which are limited in frequency generation capability. The conventional "mix-and-divide" direct synthesizers do use cascaded stages but are nonetheless essentially limited to narrow bandwidth operation. Typically, only the sum sideband is passed from the mixer output by a single output filter and the divider N is essentially limited to 4 because problems are encountered with use of higher N values.

Expansion of the bandwidth of mix-and-divide synthesizers has required additional fixed frequency inputs. In turn, the output filter skirt becomes limiting and rejection of the added frequencies requires additional filters. Thus, bandwidth expansion is possible but the resulting mix-and-divide circuitry soon becomes highly complex. In any case, spur and phase noise performance of mix-and-divide synthesizers has been inadequate to meet state-of the-art requirements.

R. J. Papajeck U.S. Pat. No. 4,725,786 entitled FULL-OCTAVE DIRECT FREQUENCY SYNTHESIZER and issued on Feb. 16, 1988 (hereinafter referred to as the 786 patent) discloses a direct frequency synthesizer that has cascaded stages, and divider of ratio ten, and operates with limited improvement in switching time and spur and phase noise performance.

The 786 cascaded circuit design is directed to achieving full octave bandwidth for a specific frequency range, i.e. 500 MHz to 1000 MHz, with use of a specific divider ratio 10. Further, mixer, filter, and switching circuitry is made relatively complex to produce a continuous full-octave frequency generation capability. Some of the stages have like circuit designs, but other stages disadvantageously have different circuit designs needed to meet specific mixing, filtering and switching requirements.

Overall, the 786 patent is structured to a specific divider ratio (10) and has limited switching time and spur and phase noise performance and is encumbered with circuit complexities which detract from product reliability, efficiency and economy.

In U.S. Pat. No. 5,166,629, entitled Direct Frequency Synthesis, issued on Nov. 24, 1992 to Grant Watkins et al., there is disclosed a direct frequency synthesizer that represents a basic advance in the state of the pertaining art. The Watkins direct frequency synthesizer includes a source for a set of fixed input frequency signals and a source for a set of selectable frequency signals. The input signals are applied through divider means having a divisor equal to N. The selectable frequency signals are spaced from each other by $\theta$ and extend from $f_1$ to $(f_1+j\theta)$. The divided input signals and the selectable frequency signals are selectively coupled to mixing means which has an output coupled to output filter means. To provide continuous output frequency coverage at the filter means output, a predetermined relationship is established among N, n and $\theta$, in the frequency span associated with the touching of the highest edge of a mixing means sum band and the lowest edge of a mixing means difference band.

The prior Watkins direct frequency synthesizer is directed to wideband operation with high performance, such as 60% to 500% bandwidth, and with spurious performance of −110/−120 dBc. For some applications, such bandwidth and spurious performance are not needed. The prior Watkins synthesizer requires expensive multi-channel switched filters at the output to achieve its high performance.

Other prior synthesizers by Kroupa have been incapable of −70 dBc spurious performance because of 2L-2I mixing products associated with using the sum output sideband, and the frequency ratios at the two mixer input ports.

In short, the prior art has not had available a low-cost, direct frequency synthesizer having moderate bandwidth with good noise and spurious performance and fast switching so as to be widely applicable to commercial and military applications.

SUMMARY OF THE INVENTION

The present invention is directed to a low cost direct frequency synthesizer that operates with moderate bandwidth, good noise performance, superior spurious performance, and fast switching.

A direct frequency synthesizer comprises a source for at least one starter frequency signal $f_o$ and a source for a set of LO frequency signals $f_1$ through $f_n$ spaced from each other by a frequency increment $\delta$. A mixer circuit generates a product of the starter frequency signal and the LO frequency signals.

A divider has a divider ratio equal to N. The number of LO frequency signals is equal to or less than N. The starter frequency $f_o$ has a value equal to $\delta$ times (N+x) where x is equal to 0 or a positive integer. The LO frequency $f_1$ has a value equal to $(N+1)f_o$.

An intermediate nonswitchable band pass filter passes a difference portion of the mixer product to the divider, and a nonswitchable output band pass filter receives an output from the divider to generate a moderate bandwidth output.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate a preferred embodiment of the invention and together with the description provide an explanation of the objects, advantages and principles of the invention. In the drawings:

FIG. 5 shows another specific embodiment of FIG. 1 in which fewer than N frequencies are employed as a set of LO mixer frequencies in which only two stages are cascaded and tuning bandwidth less than Nδ is achieved;

FIG. 11 shows an elemental Kroupa DF synthesizer of the prior art; and

DESCRIPTION OF THE INVENTION

In accordance with the present invention, a DF synthesizer includes one or more stages each of which has a relatively simple, low cost circuit configuration that operates with fast frequency switching and with basic synthesizer parameters interrelated to provide a low noise output having moderate bandwidth and superior spurious performance.

A set of LO frequencies are beat against a starter frequency, and the difference mixer product is applied to a frequency divider having a divider ratio N. The LO frequencies are preferably separated by a frequency increment δ and defined as a function of N. The starter frequency is defined as a function of N and δ.

Conventional DF technology as represented by Kroupa will first be described in greater detail to provide a basis for a better understanding of the invention.

A Kroupa DF synthesizer 10P Of the prior art is shown in FIG. 11. The prior art DF synthesizer 10P includes a first stage 12P which is cascaded with additional like stages through an nth stage 14P.

The stage 12P receives a starter frequency signal $F_o$ as an input that is mixed with LO frequency signals $f_1$, $f_1$+δ, $f_1$+2δ, $f_1$+3δ in a mixer 16P. The mixer 16P has 2L-2I mixing products associated with use of the sum output sideband and the frequency ratios at the two mixer input ports thereby limiting performance to −40 to −50 dBc.

The mixer output is applied to a band pass filter (BPF) 18P which in turn is coupled to a divide-by-4 divider 20P. The divider output is coupled to another BPF 22P.

The output from the BPF 22P is applied as an input to the next stage of the DF synthesizer 10P. The next and subsequent stages are alike except for differences in the frequency passband, and are cascaded together and with the nth output stage 14P. A BPF 24P and a BPF 26P are employed in the output stage 14P. The BPF 26P generates a frequency output $f_{out}$.

The data in Table 1 applies to the prior art DF synthesizer 10P:

TABLE 1

$F_{outmin} = f_1 + f_o = 4f_o$
$F_{outmax} = f_1 + f_o + 4δ$
$F_{mid} = f_i + f_o + 2δ$
$BW = 4δ$
$Y = \dfrac{f_{mid} - (f_1 + 3δ)}{BW} = \dfrac{f_1 + f_o + 2δ - f_1 - 3δ}{BW}$ $\%BW = \dfrac{4δ}{4f_o + 2δ}$   $Y = \dfrac{f_o - δ}{4δ}$

| $f_o$ | Y Filter | Filter % BW |
|---|---|---|
| 4δ | 3/4 = .75 | 4/18 = 22.22% |
| 5δ | 4/4 = 1.0 | 4/22 = 18.18% |
| 6δ | 5/4 = 1.25 | 4/26 = 15.38% |
| 7δ | 6/4 = 1.5 | 4/30 = 13.33% |
| 8δ | 7/4 = 1.75 | 4/34 = 11.76% |
| 9δ | 8/4 = 2.0 | 7/38 = 10.53% |

Figure 12:
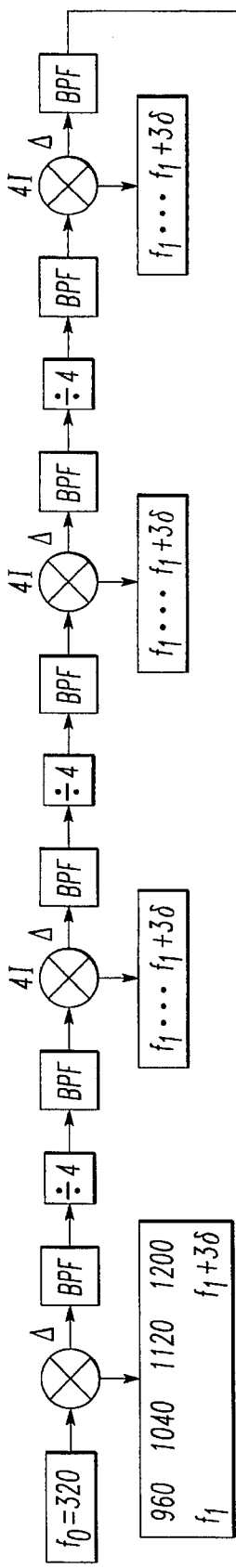
FIG. 12 shows a cascaded Kroupa DF synthesizer of the prior art, in which E mixer output is used and resulting sporious output is inferior to disclosed technique.
Figure 12:
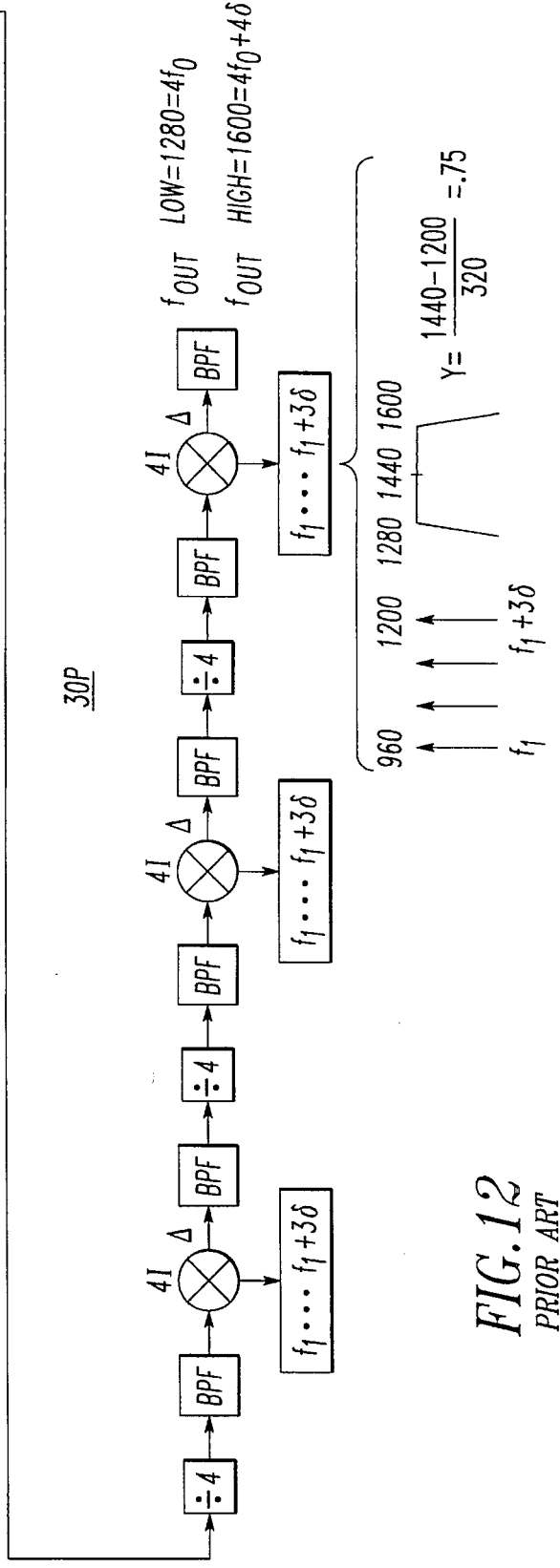

In FIG. 12, there is shown a specific example of the prior art Kroupa DF synthesizer design. Thus, a DF synthesizer 30P employs mixers run in the sum mode and BPF elements providing the indicated frequency passbands. The final output tunes 1280–1600 with 2*2 spurs in the passband. This performance is degraded as compared to performance provided by the present invention as will become more evident subsequently herein.

Figure 1:
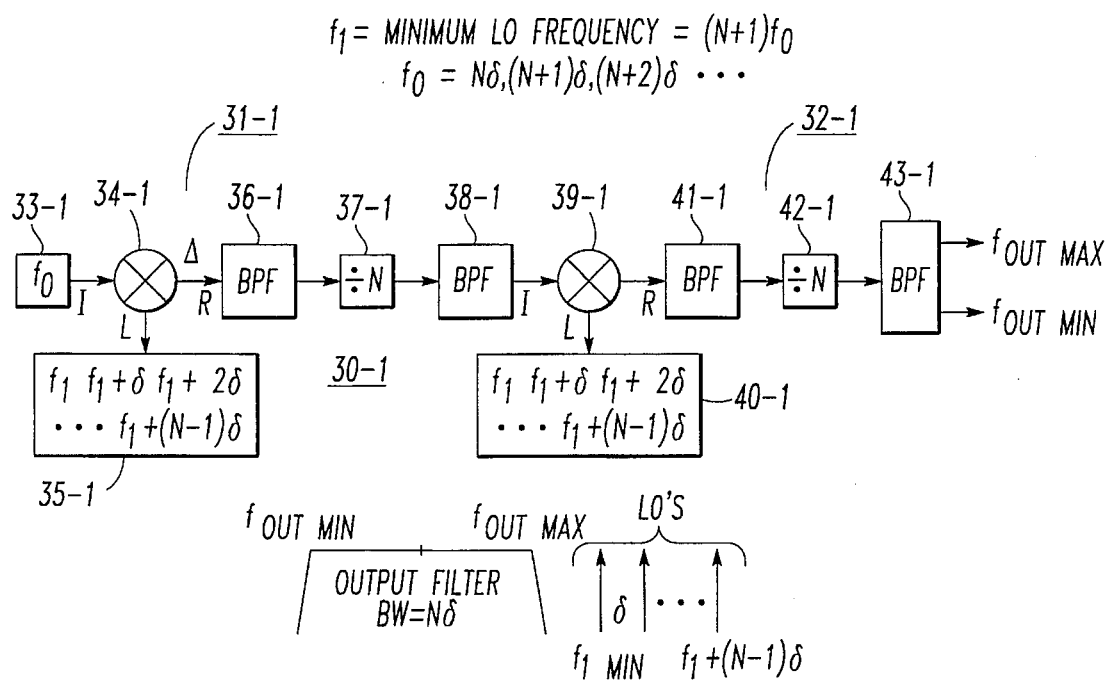
FIG. 1 represents a basic configuration of a direct frequency (DF) synthesizer having basic parameters including a generalized divider ratio N, a starter frequency fo, LO frequencies with a defined minimum value, and frequency increments δ interrelated and otherwise arranged in accordance with the principles of the invention.

In FIG. 1, a generalized DF synthesizer 30-1 has a basic circuit structure arranged in accordance with the basic concepts of the invention. The DF synthesizer 30-1 can have a single stage or multiple cascaded stages that are structurally alike with differences in parameter values. The DF synthesizer in this illustrative case has a first stage 31-1 and a second output stage 32-1.

The first stage 31-1 has a frequency source 33-1 that supplies a starter frequency $f_o$ for mixing in a mixer 34-1 with a set of LO frequency signals $f_1$ through $f_n$ supplied by a LO frequency source 35-1. A BPF 36-1 has a fixed pass band that preferably is nonswitchable and passes only the difference mixing product from the mixer 34-1 to a frequency divider 37-1 having a frequency divider ratio N. A BPF 38-1 also is preferably nonswitchable and has a fixed pass band that passes the difference mixing product from the frequency divider 37-1 as an input to a mixer 39-1 in the output stage 32-1 for mixing with the set of LO frequencies supplied by a frequency source 40-1.

A common frequency generator may generate the starter frequency signal $f_o$ and the LO frequency signals for the described frequency sources.

A BPF 41-1 is provided with a fixed pass band and passes the difference product from the mixer 39-1 to a frequency divider 42-1 having a frequency divider ratio N. The divider output is preferably applied to a nonswitchable output BPF 43-1 that has a fixed pass band and yet produces an output signal having a moderate bandwidth from $f_{outmin}$ to $f_{outmax}$. Costly switchable band pass filters needed for outputs having wider bandwidths are thus avoided.

Figure 2:
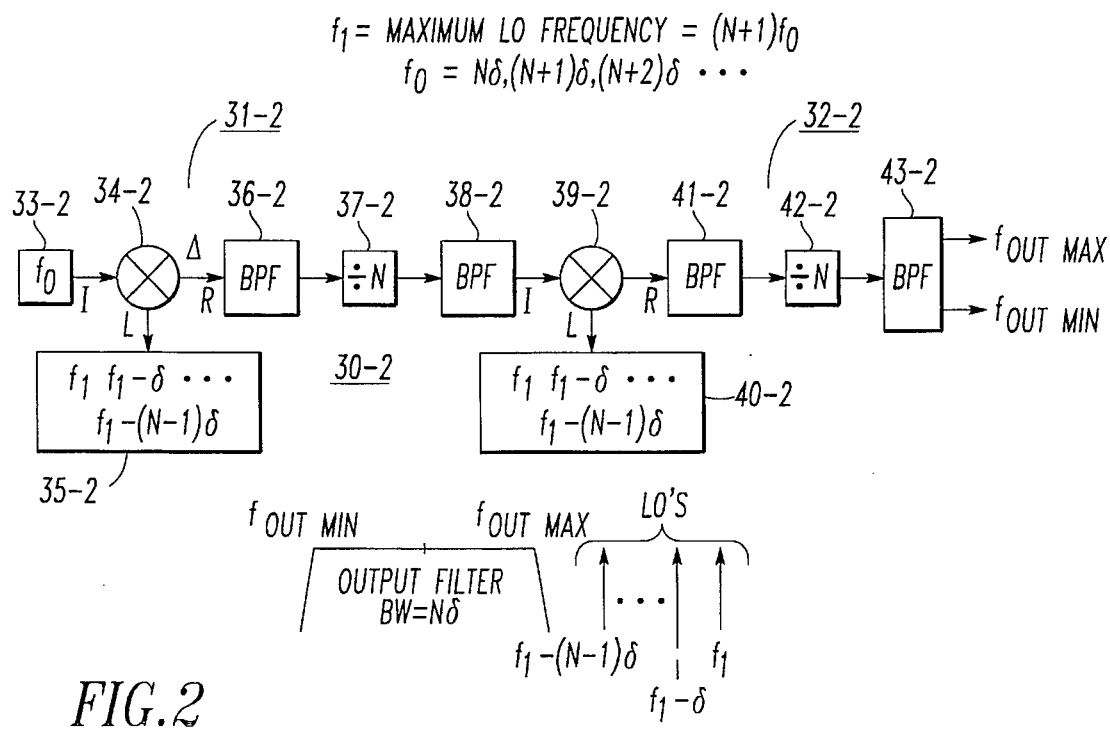
FIG. 2 is similar to FIG. 1 except that a defined maximum value is provided for the LO frequencies.

In FIG. 1, the LO frequency $f_1$ has a minimum value equal to $(N+1)f_o$ with the frequency increment δ being successively added to $f_1$ to obtain successive LO frequencies in the LO frequency set. In FIG. 2, a DF synthesizer 31-2 has components like those of the DF synthesizer 31-1 of FIG. 1, but $f_1$ has a maximum value equal to $(N+1)f_o$ with the frequency increment $\delta$ being successively subtracted from $f_1$ to obtain successive LO frequencies in the LO frequency set. Like circuit elements employed in FIGS. 1 and 2 are accordingly designated by corresponding reference characters.

The following equations apply to FIG. 1:

Ultimate Tuning Output Bandwith = $N\delta$ for cascaded stages $F_{outmin} = Nf_o - N\delta/(N+1)$ $F_{outmax} = Nf_o + [\delta N^2/(N+1)]$ $F_{mid} = N\left[f_o + \left(\dfrac{\delta}{2} \ \dfrac{N-1}{N+1}\right)\right]$ Filter Shape Factor = $Y = \dfrac{f_1 - f_{mid}}{BW} = \dfrac{f_o - \dfrac{N\delta}{2}\left(\dfrac{N-1}{N+1}\right)}{N\delta}$ Filter % Bandwidth = $\dfrac{BW}{f_{mid}} = \dfrac{\delta}{f_o + \dfrac{\delta}{2}\left(\dfrac{N-1}{N+1}\right)}$ The following equations apply to FIG. 2:

Ultimate Tuning Output Bandwith = $N\delta$ $F_{outmin} = Nf_o - N^2\delta/(N+1)$ $F_{outmax} = Nf_o + N\delta/(N+1)$ $F_{mid} = N\left[f_o - \dfrac{\delta(N-1)}{2(N+1)}\right]$ % Bandwidth = $\dfrac{BW}{f_{mid}} = \dfrac{\delta}{f_o \pm \dfrac{\delta(N-1)}{2(N+1)}}$ $Y = \dfrac{f_1 - (N-1)\delta - f_{mid}}{BW} = \dfrac{f_o - \delta(N-1) + \dfrac{N\delta(N-1)}{2(N+1)}}{N\delta}$ Since only the difference mixing product is used, superior spurious mixer performance is achieved. As the divider ratio N increases, spurious mixer performance improves. N must be an integer.

For a given frequency divider ratio N, N fixed selectable frequencies (LO frequencies) are preferably provided and separated from each other by the frequency increment $\delta$. The ultimate output tuning bandwidth is ($N\delta$).

The starter frequency is $f_o$, which is preferably selected from a set of values $N\delta$, $(N+1)\delta$, $(N+2)\delta$, through $(N+x)\delta$. The particular value chosen for $f_o$ can be any value selected from the set of values.

In FIG. 1, the minimum selectable LO frequency is $f_1$, where $f_1=(N+1)f_o$. In FIG. 2, the maximum selectable LO frequency is $f_1$, where $f_1=(N+1)f_o$. For a given N, $f_o$ and $\delta$, FIG. 1 gives a better filter shape factor Y, but a smaller percentage tuning bandwidth than FIG. 2. Since the LO frequencies are outside the output bandwidth, superior spurious performance is enabled.

Figure 3:
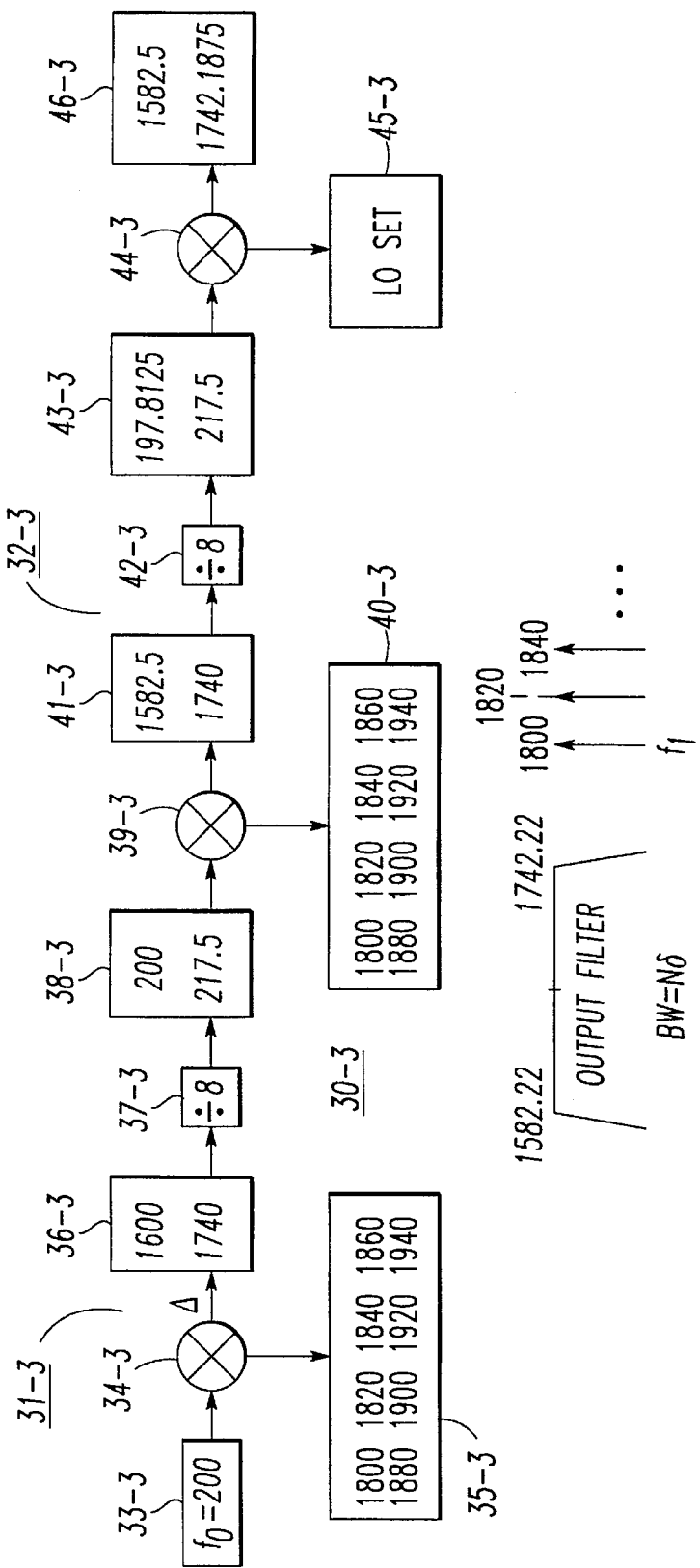
FIGS. 3 and 4 respectively show specific embodiments of FIGS. 1 and 2 in which N=8, $f_o$=200, and δ=20.
Figure 4:
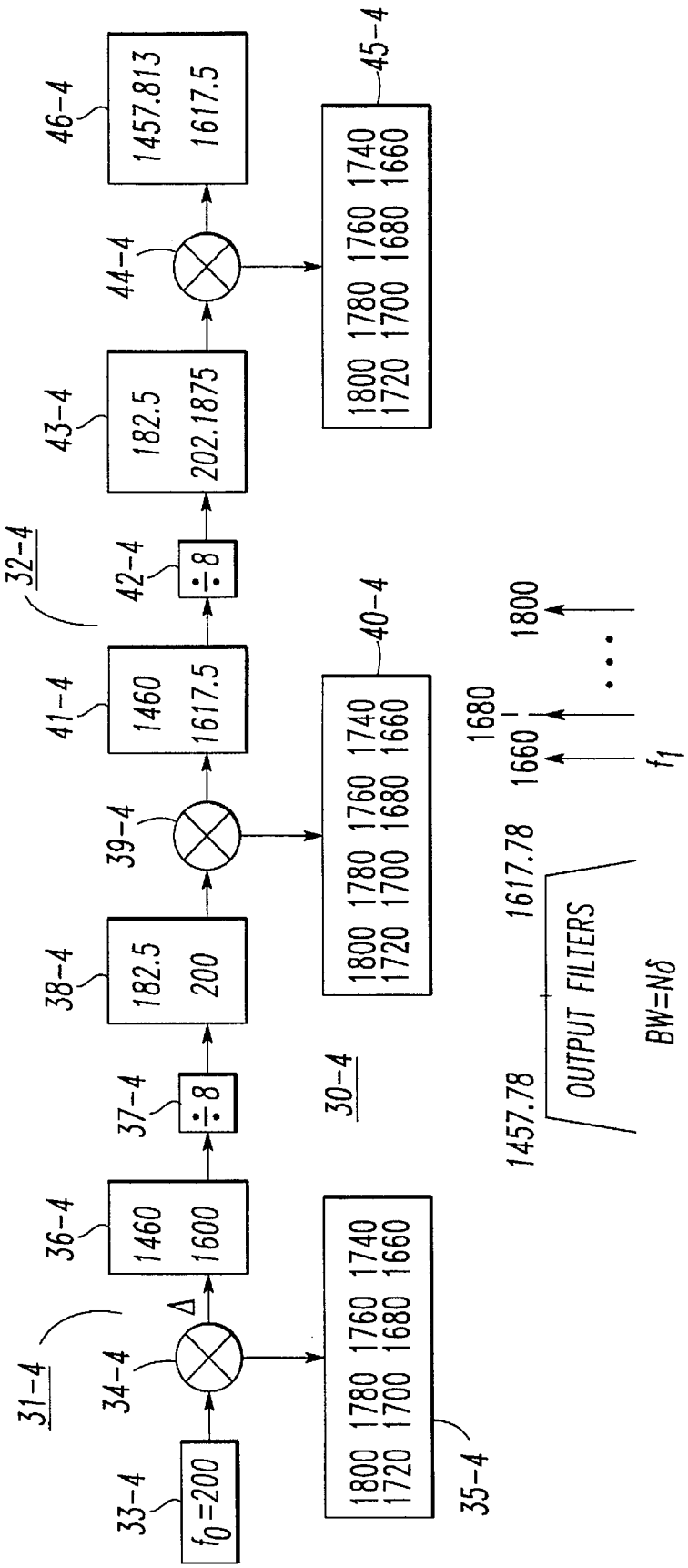

FIGS. 3 and 4 show respective DF synthesizers 30-3 and 30-4 in which N=8, $f_o$=200 and $\delta$=20. Eight LO frequencies are preferably employed.

In FIG. 3, a third stage is cascaded with a mixer 44-3, a LO frequency generator 45-3 and an output BPF 46-3, N=8 and $f_{1min}=(N+1)f_o$=1800 MHz=minimum selectable LO frequency. The filter shape factor is Y=0.8611 percentage tuning bandwith is 9.627%. The worst in-band spurious mixing product is 8I.

In FIG. 4, N=8 and a third stage is cascaded and $f_{1max}=(N+1)f_o$=1800 MHz=maximum selectable LO frequency. The filter shape factor is Y=0.764 and the percentage tuning bandwith is 10.4%. Again, the worst in-band spurious mixing product is 8I.

In the embodiments of FIGS. 3 and 4, as well as other applications of the invention, no selectable switched filter banks are required. Filters before the frequency dividers in successive stages are preferably identical. Filters after the frequency dividers in successive stages are preferably identical.

For m cascaded frequency divider stages, the final output frequency increment =

$$\dfrac{\delta}{N^m}.$$

The advantage of a large N is superior mixer spurious performance, smaller frequency increment per stage, and larger output bandwidth for constant $\delta$.

The following equations apply to FIG. 3:

$F_{outmin} - Nf_o - \dfrac{N\delta}{N+1} = 1600 - \dfrac{8(20)}{9} = 1582.22$ MHz $F_{outmax} - Nf_o + \dfrac{\delta N^2}{N+1} = 1600 + \dfrac{20(64)}{9} = 1742.22$ MHz $F_{mid} = N\left[f_o + \dfrac{\delta}{2}\left(\dfrac{N-1}{N+1}\right)\right] = 8\left[200 + 10\left(\dfrac{7}{9}\right)\right] = 1662.22$ MHz $Y = \dfrac{f_o - \dfrac{N\delta}{2}\left(\dfrac{N-1}{N+1}\right)}{N\delta} = \dfrac{(200 - 80(7/9)}{160} = 0.8611$ $\% BW - \dfrac{\delta}{f_o + \dfrac{\delta}{2}\left(\dfrac{N+1}{N+1}\right)} = \dfrac{20}{200 + 10\left(\dfrac{7}{9}\right)} = 9.626\%$ The following equations apply to FIG. 4:

$F_{outmin} = Nf_o - \dfrac{N^2\delta}{N+1} = 1600 - \dfrac{64(20)}{9} = 1457.78$ MHz $F_{outmax} = Nf_o + \dfrac{N\delta}{N+1} = 1600 + \dfrac{8(20)}{9} = 1617.78$ MHz $F_{out\ mid} = N\left[f_o - \dfrac{\delta}{2} \ \dfrac{N-1}{N+1}\right] = 8\left[200 - \dfrac{20(7)}{18}\right] = 1537.78$ MHz % Bandwidth = $\dfrac{\delta}{f_o - \dfrac{\delta(N-1)}{2(N+1)}} = \dfrac{20}{200 - \dfrac{20}{2}\left(\dfrac{7}{9}\right)} = 10.4\%$ $Y = \dfrac{f_o - \delta(N-1) + \dfrac{N\delta(N-1)}{2(N+1)}}{N\delta} = \dfrac{200 - 20(7) + 8(20)\ (7)/18}{8(20)} = 0.764$ In FIG. 5, another embodiment of the invention is shown in which a DF synthesizer 30-5 employs a set of LO frequency signals fewer in number than N. Elements corresponding to elements in FIG. 1 have corresponding reference characters. While it is preferred to have the number of LO frequencies equal to N, some LO frequency signals can be omitted, as in the DF synthesizer 30-5, to meet design specifications for a DF synthesizer with some reduction of output bandwidth and limited number of stages.

Figure 6:
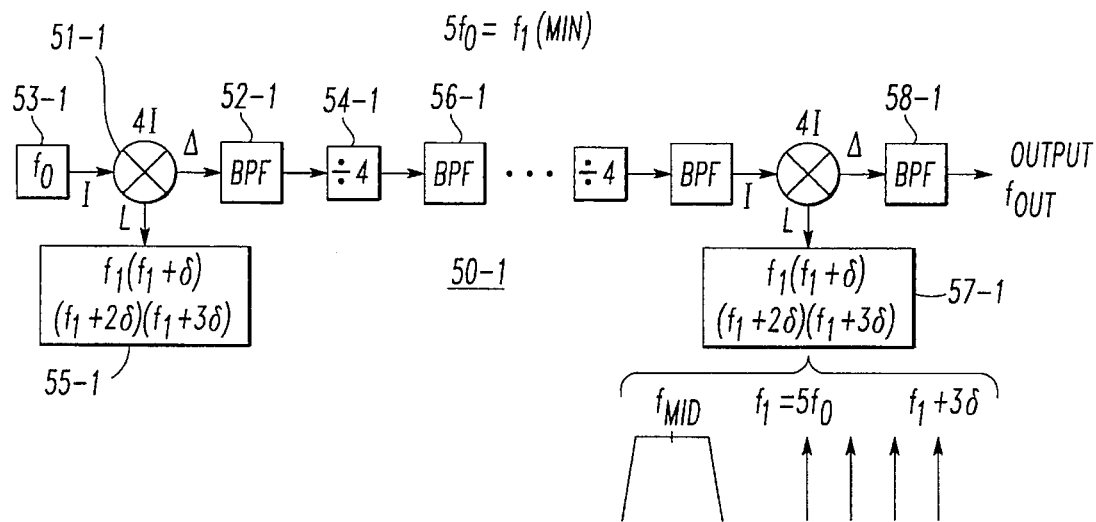
FIGS. 6 and 7 respectively show additional embodiments of FIGS. 1 and 2 in which generalized parameters and a divider ratio N=4 are employed in accordance with the invention.
Figure 7:
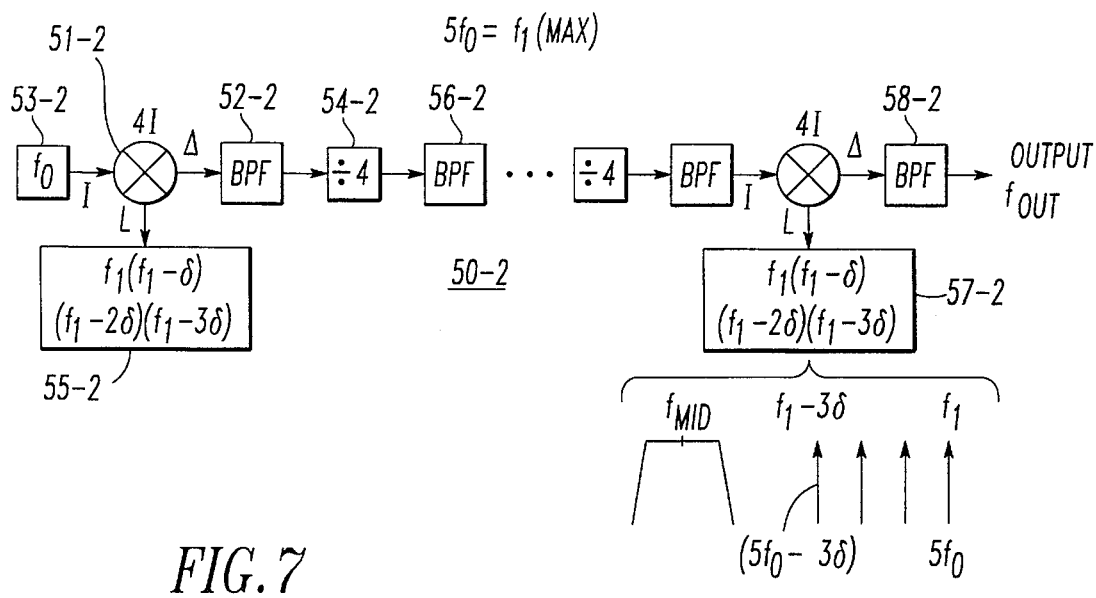

Additional embodiments of the invention are shown in FIGS. 6 and 7. A DF synthesizer comprises a first stage 50-1 or 50-2, a mixer 51-1 or 51-2 (having mixing products 4I), a fixed pass band BPF 52-1 or 52-2, a divide-by-4 divider 54-1 or 54-2 and an output BPF 56-1 or 56-2 having a fixed pass band. Additional like stages are cascaded together with an nth stage 58-1 or 58-2 which generates the output frequency.

In the DF synthesizer 50-1 or 50-2, frequency spacing between four fixed selectable LO frequencies is $\delta$. These four frequencies are distributed to the required number of cascaded stages. One of the four frequencies is $5 f_o$, where $f_o$ is the starter frequency and equal to the fourth or greater harmonic of $f_o$. Further, $f_o$ must be divisible by four, with no remainder. The ultimate tuning bandwidth achievable is $4\delta$, and the frequency incremental step size is $(\delta/4^m)$, where m is the number of cascaded stages.

Superior spurious performance is achieved because all stages use only the difference mixing product. Such spurs are determined by 4I mixing products, which are typically −70 dBc. The 4*0 product is typically 30 dB better than the 2*2 product experienced with prior art synthesizer, for most mixers when driven at −3 dBm input at the I or R port. Such a high drive level is usually required to maintain good phase noise performance, i.e., −150 dBc floor. With lower mixer drive levels, the 4*0 spurious improves at a faster rate than the 2*2 product. Thus, −90 dBc spur performance is achieved with degraded noise performance.

DF synthesizers arranged in accordance with the invention embodiments of FIGS. 6 and 7 have the advantage that only four fixed LO frequencies are required, and no switched filter banks are required. All stages can be manufactured with identical filters, so that cost and simplicity can be optimized. Since the four fixed LO frequencies are absent from the output filter passband, shielding can be minimized with cost reduction.

The following data in Tables 2 and 3 respectively represent the performance of the DF synthesizers 50-1 and 50-2:

TABLE 2

$F_{outmin} = 4f_o - 0.8\delta$
$F_{outmid} = 4f_o + 1.2\delta$
$F_{outmax} = 4f_o + 3.2\delta$
$BW = 4\delta$
$f_{min} = 5f_o$ $$Y = \frac{f_1 - f_{mid}}{BW} = \frac{5f_o - (4f_o + 1.2\delta)}{4\delta}$$

$$\% BW = \frac{4\delta}{4f_o + 1.2\delta} \qquad Y = \frac{f_o - 1.2\delta}{4\delta}$$

| $f_o$ | Y Filter | Filter % BW |
|---|---|---|
| $4\delta$ | 2.8/4 = 0.700 | 4/17.2 = 23.26% |
| $5\delta$ | 3.8/4 = 0.95 | 4/21.2 = 18.87 |
| $6\delta$ | 4.8/4 = 1.20 | 4/25.2 = 15.87 |
| $7\delta$ | 5.8/4 = 1.45 | 4/29.2 = 13.70 |
| $8\delta$ | 6.8/4 = 1.70 | 4/33.2 = 12.05 |
| $9\delta$ | 7.8/4 = 1.95 | 4/37.2 = 10.75 |

TABLE 3

$F_{outmin} = 4f_o - 3.2\delta$
$F_{outmid} = 4f_o - 1.2\delta$
$F_{outmax} = 4f_o + 0.8\delta$
$BW = 4\delta$ $$Y = \frac{f_1 - 3\delta - f_{mid}}{BW} = \frac{(5f_o - 3\delta) - (4f_o - 1.2\delta)}{4\delta}$$

$BW = 4\delta$ $$\% BW = \frac{4\delta}{4f_o - 1.2\delta} \qquad Y = \frac{f_o - 1.8\delta}{4\delta}$$

$4\delta$
$f_1 (max) = 5f_o$

| $f_o$ | Y Filter | Filter % BW |
|---|---|---|
| $4\delta$ | 2.2/4 = 0.55 | 4/14.8 = 27.03% |
| $5\delta$ | 3.2/4 = 0.80 | 4/18.8 = 21.28% |
| $6\delta$ | 4.2/4 = 1.05 | 4/22.8 = 17.54% |
| $7\delta$ | 5.2/4 = 1.30 | 4/26.8 = 14.93% |
| $8\delta$ | 6.2/4 = 1.55 | 4/30.8 = 13.0% |

Various relationships and output filter shape factor are shown in FIG. 6 as a function of the starter frequency $f_0$ and fixed LO frequency spacing—$\delta$—for the case of $5f_o$=minimum LO=$f_1$. The ultimate output tuning band for several cascaded stages using the difference output is:

$$F_{OUT\ MIN} = f_1 - f_o - 0.8\delta = 4f_o - 0.8\delta$$

$$F_{OUT\ MAX} = 4f_o + 3.2\delta \text{ with } f_o = 4\delta, 5\delta, 6\delta \ldots$$

The output filter shape factor Y improves/increases as $f_o$ is selected to be valued with a larger number of $\delta$'s.

FIG. 7 shows relationships for $5f_o$=maximum LO= $f_1$ using the difference output:

$$f_{OUT\ MIN} = 4f_0 - 3.2\delta$$

$$f_{OUT\ MAX} = 4f_0 + 0.8\delta \text{ with } f_0 = 4\delta, 6\delta \ldots$$

The shape factor of FIG. 6 is better than that of FIG. 7.

Figure 8:
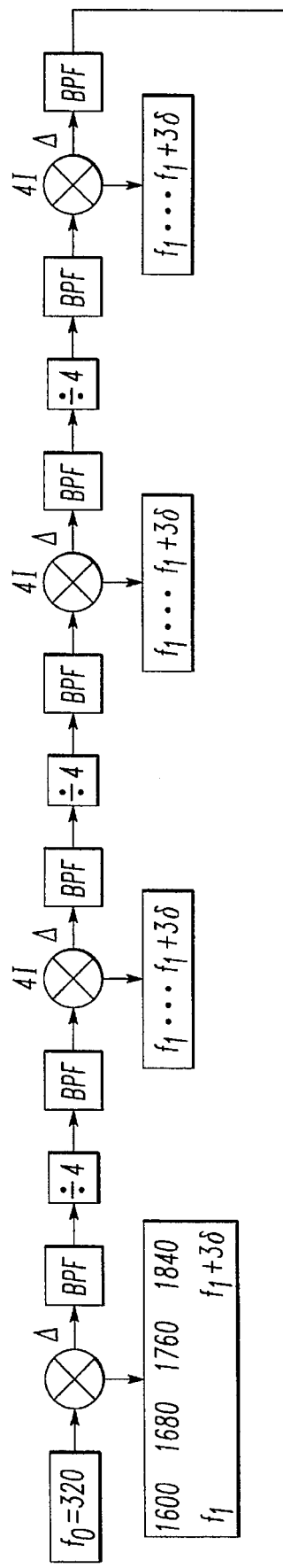
FIG. 8 shows DF synthesizer stages of FIG. 6 cascaded and otherwise embodied to form a DF synthesizer tunable from 1216 to 1536 MHz in accordance with the invention.
Figure 8:
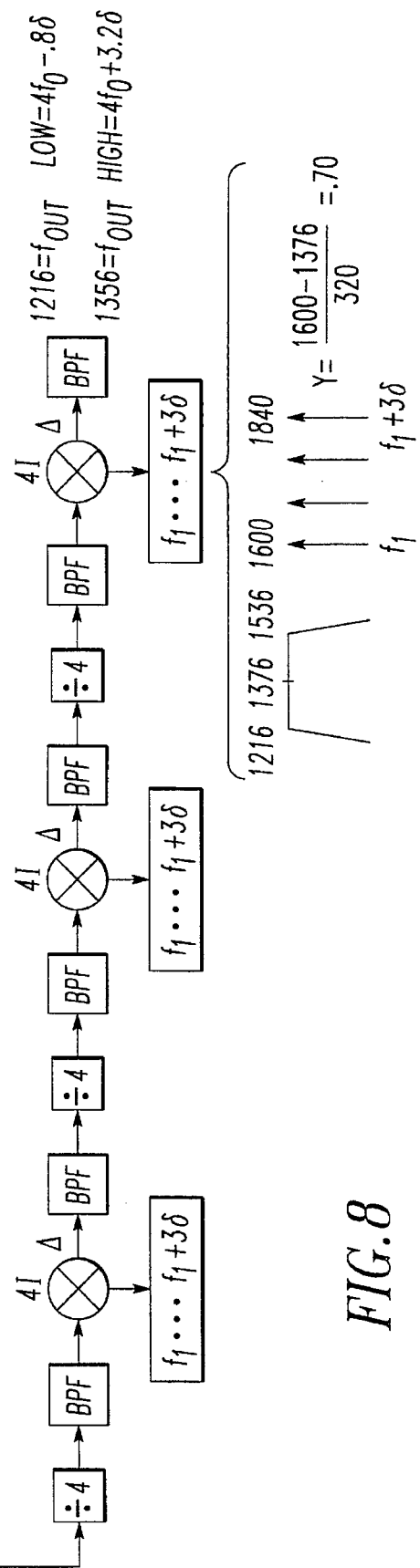

In FIG. 8 a DF synthesizer 60 is shown as a specific seven-step example of the embodiment of FIG. 6 with $LO_{MIN}=5f_0=1600$ MHz. The final output is capable of tuning from 1216 to 1536 MHz. Three stages are cascaded to obtain output frequency increments of 5 MHz. Because the total output range is not required, the final output stage needs LOs at only 1760 and 11840 MHz and the final output filter shape factor is improved to Y=1.30. More tuning range is available for future growth since the final output filter is relatively narrowed and only two LO's are used.

Figure 9:
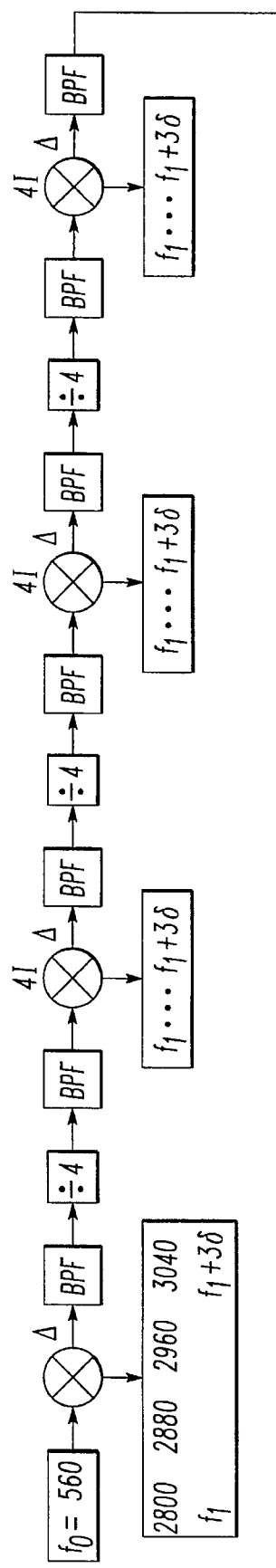
FIG. 9 shows DF synthesizer stages of FIG. 6 cascaded and otherwise embodied to form a DF synthesizer tunable from 2176 to 2496 MHz in accordance with the invention.
Figure 9:
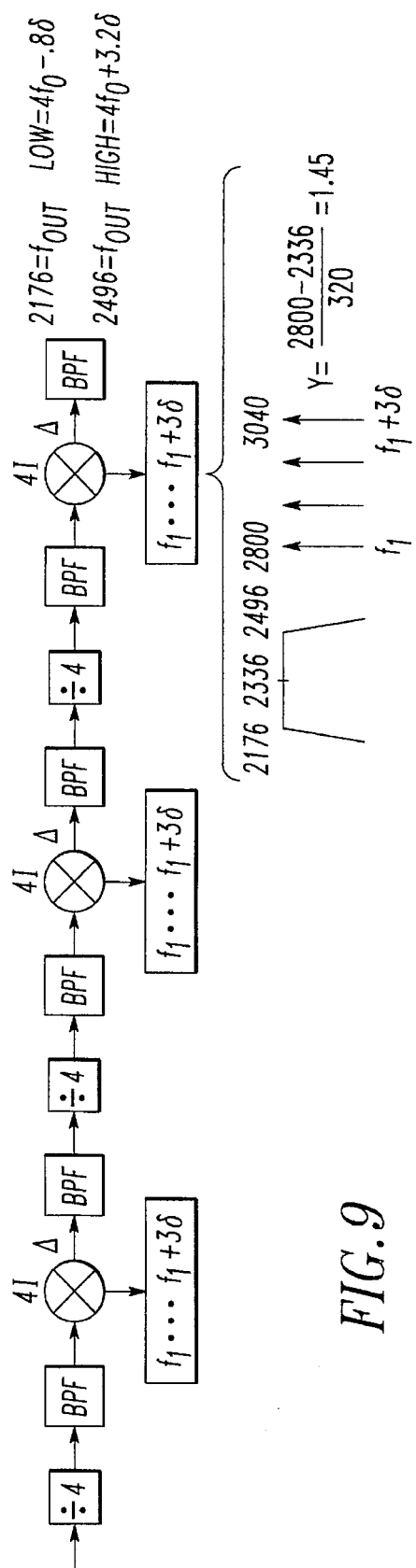

FIG. 9 shows another seven-step DF synthesizer 62 that is another specific example of the embodiment of FIG. 6 with $LO_{MIN}=5f_0=2800$ MHz. The final output tunes from 2176 to 2496 MHz with improved filter shape factors.

Figure 10:
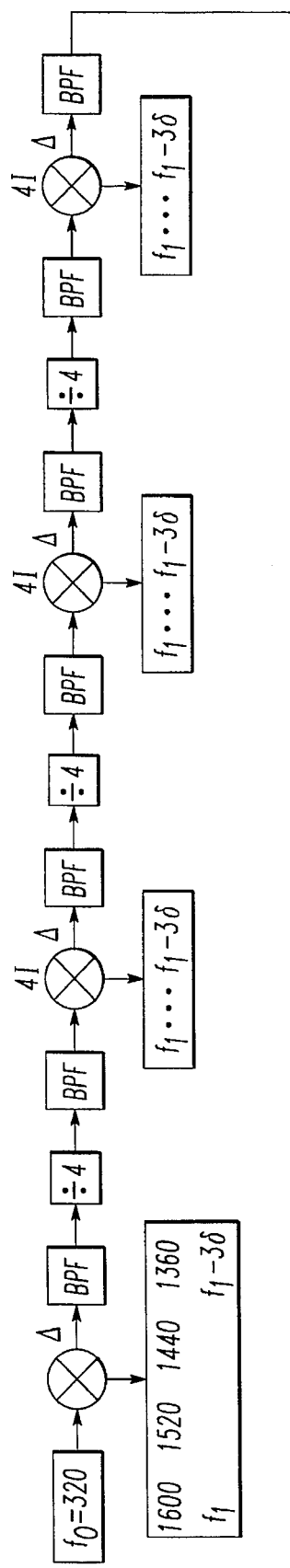
FIG. 10 shows the DF synthesizer stages of FIG. 7 cascaded and otherwise embodied to form a cascaded DF synthesizer tunable from 1024 to 1344 MHz in accordance with the invention.
Figure 10:
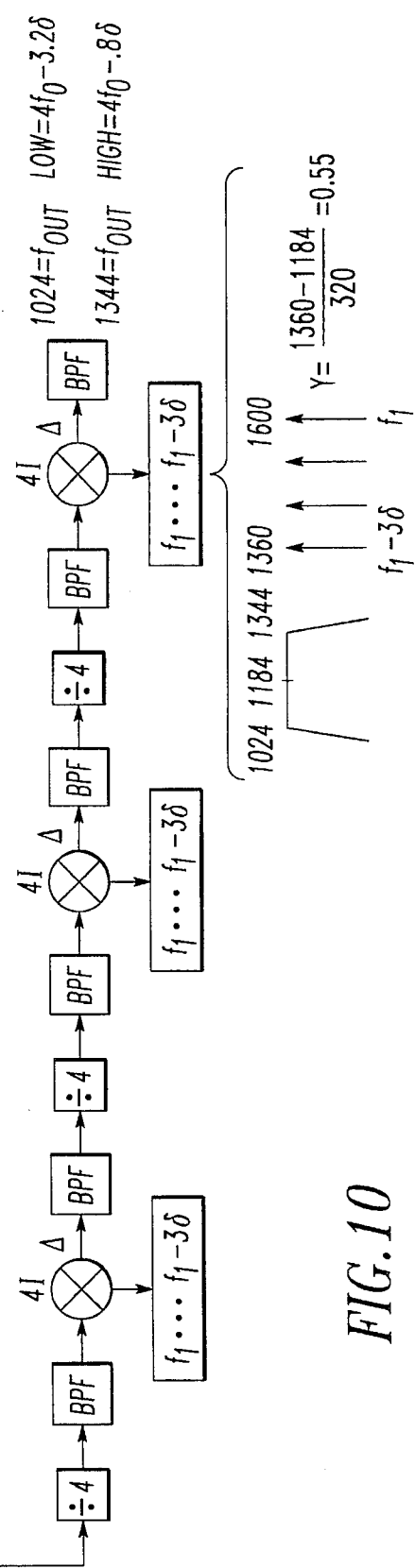

FIG. 10 shows a seven-step DF synthesizer 64 that is a specific example of the embodiment of FIG. 7 with $LO_{MAX}=5f_0=1600$ MHz. The final output tunes from 1024 to 1344 MHz with output filter shape factor somewhat degraded relative to FIG. 1.

The described invention provides a family of cascadable frequency synthesizers which are directly applicable to commercial and military use where cost is of prime importance. The synthesizers are capable of tuning moderate bandwidths—10% to 25%—with good noise, −150 dBc floor, fast switching, and better than −70 dBc spurious performance.

The foregoing description of the preferred embodiment has been presented to illustrate the invention. It is not intended to be exhaustive or to limit the invention to the form disclosed. In applying the invention, modifications and variations can be made by those skilled in the pertaining art without departing from the scope and spirit of the invention. It is intended that the scope of the invention be defined by the claims appended hereto, and their equivalents.

We claim:

1. A direct frequency synthesizer comprising:

a source for at least one starter frequency signal $f_o$;

a source for a set of LO frequency signals $f_1$ through $f_n$ spaced from each other by a frequency increment $\delta$;

a mixer circuit for generating a product of the starter frequency signal and the LO frequency signals said product having a difference portion;

a divider having a divider ratio equal to N;

the number of LO frequency signals being equal to an integer or less than N;

the starter frequency $f_o$ having a value equal to $\delta$ times (N+x) where x is equal to 0 or a positive integer;

the LO frequency $f_1$ having a value equal to $(N+1)f_o$;

an intermediate nonswitchable band pass filter for passing only the difference portion of the mixer product to the divider; and a nonswitchable output band pass filter receiving an output from the divider to generate a moderate bandwidth output.

2. The direct frequency synthesizer of claim 1 wherein the number of LO frequencies equals N.

3. The direct frequency synthesizer of claim 2 wherein the LO frequency $f_1$ value is a minimum frequency value and the frequency increment $\delta$ is successively added to $f_1$ to define successive LO frequencies in the LO frequency set.

4. The direct frequency synthesizer of claim 2 wherein the LO frequency $f_1$ value is a maximum frequency value and the frequency increment $\delta$ is successively subtracted from $f_1$ to define successive LO frequencies in the LO frequency set.

5. The direct frequency synthesizer of claim 1 wherein the defined circuit structure constitutes a first synthesizer stage and at least a second synthesizer stage is provided, the second synthesizer stage comprising:

a second source for a set of LO frequency signals $f_1$ through fn spaced from each other by a frequency increment $\delta$;

a second mixer circuit for generating a second mixer product of an output frequency signal from the first stage and the LO frequency signals, said second mixer product having a second difference portion ;

a second divider having a divider ratio equal to an integer N;

the number of LO frequency signals being equal to or less than N;

the LO frequency $f_1$ having a value equal to $(N+1)f_o$;

a second intermediate nonswitchable band pass filter for passing only the difference portion of the second mixer product to the divider;

a second nonswitchable output band pass filter receiving an output from the divider to generate a moderate bandwidth output; and the output from the output band pass filter of the first stage coupled to the second mixer circuit.

6. The direct frequency synthesizer of claim 5 wherein multiple synthesizer stages are provided and each stage is structured like the second stage, and the second and successive stages are coupled to each other as the first and second stages are coupled.

7. The direct frequency synthesizer of claim 2 wherein N equals 4.

8. The direct frequency synthesizer of claim 2 wherein N equals 8.

* * * * *